United States Patent
Smirnov et al.

(10) Patent No.: US 8,189,812 B2
(45) Date of Patent: May 29, 2012

(54) BASS BOOST FILTERING TECHNIQUES

(75) Inventors: Serge Smirnov, Redmond, WA (US); Qunli Li, Woodinville, WA (US); James D. Johnston, Redmond, WA (US); John Bregar, Seattle, WA (US)

(73) Assignee: Microsoft Corporation, Redmond, WA (US)

( * ) Notice: Subject to any disclaimer, the term of this patent is extended or adjusted under 35 U.S.C. 154(b) by 1370 days.

(21) Appl. No.: 11/770,616

(22) Filed: Jun. 28, 2007

(65) Prior Publication Data

US 2008/0212797 A1    Sep. 4, 2008

Related U.S. Application Data

(60) Provisional application No. 60/904,753, filed on Mar. 1, 2007.

(51) Int. Cl.
    *H03G 5/00*    (2006.01)
(52) U.S. Cl. ............ 381/98; 381/101; 381/102; 381/61; 381/74; 381/309; 381/118
(58) Field of Classification Search ............... 381/98, 381/56, 58, 61–63, 101–103, 74, 118–120, 381/309
    See application file for complete search history.

(56) References Cited

U.S. PATENT DOCUMENTS

| | | | |
|---|---|---|---|
| 4,739,514 A | 4/1988 | Short et al. | |
| 4,764,967 A | 8/1988 | Christopher | |
| 5,255,324 A | 10/1993 | Brewer et al. | |
| 7,016,509 B1 | 3/2006 | Bharitkar et al. | |
| 7,171,010 B2 | 1/2007 | Martin et al. | |
| 7,184,556 B1 | 2/2007 | Johnson et al. | |
| 2003/0145025 A1 | 7/2003 | Allred et al. | |
| 2004/0032959 A1 | 2/2004 | Montag et al. | |
| 2005/0094828 A1 | 5/2005 | Sugimoto | |
| 2005/0185802 A1 | 8/2005 | Yoshida | |
| 2008/0175409 A1* | 7/2008 | Lee et al. ................. | 381/98 |

OTHER PUBLICATIONS

Gardner, "3-D Audio Using Loudspeakers," <http://sound.media.mit.edu/Papers/gardner_thesis.pdf>, 153 pages, Sep. 1997.
Head-Fi, "Bass Boost Shelving Filter Equations" <http://www.head-fi.org/forums/showthread.php?t=104392>, 9 pages (accessed May 2, 2007).
Oppenheim and Schafer, "Discrete-Time Signal Processing," pp. 382-384 ($2^{nd}$ ed. Prentice-Hall 1999).

* cited by examiner

*Primary Examiner* — Vivian Chin
*Assistant Examiner* — Paul Kim
(74) *Attorney, Agent, or Firm* — Klarquist Sparkman, LLP

(57) ABSTRACT

Bass frequencies of audio can be boosted using various techniques and tools. The described techniques and tools can be applied separately or in combination. For example, bass frequencies of audio can be boosted using an integer bass boost filter by receiving user-settable parameters, such as "c" and "s" coefficients, and implementing the integer bass boost filter using a coupled form structure implementation and the user-settable parameters. Bass frequencies of audio can also be boosted using an integer bass boost filter that is configured to use any of plural coupled form structure implementations. Bass frequencies of audio can be also be boosted using a linear combination of an input audio signal and output of a high-pass filter.

17 Claims, 11 Drawing Sheets

Frequency (Hz)

BASS BOOST FILTERING TECHNIQUES

RELATED APPLICATION INFORMATION

The present application claims the benefit of U.S. Provisional Patent Application No. 60/904,753, entitled "AUDIO PLAYBACK TECHNIQUES AND TOOLS," filed Mar. 1, 2007, the disclosure of which is incorporated by reference.

BACKGROUND

In part, the quality of audio that is played back to a listener depends on how the audio was recorded and how the audio was compressed/decompressed (if at all). A playback device can sometimes perform processing during playback, however, to improve the listening experience.

Bass boost is a feature of some audio playback devices. On devices featuring microprocessors, it is often cheaper to implement bass boost in software because analog components, such as capacitors, can have a significant cost.

Many microprocessors in consumer/embedded devices do not feature floating point math capabilities. This presents a challenge when implementing bass boost because traditional filter design techniques tend to yield poles very close to the unit circle for filters whose "action" occurs at very low frequencies. Closeness of the poles to the unit circle means that integer coefficient quantization moves the pole locations, leading to two potential problems: (1) poles may get outside of the unit circle, causing instability; (2) the angle of the poles (in polar coordinates) may change significantly, causing the actual correction frequency to deviate substantially from the intended one.

Therefore, there exists ample opportunity for improvement in technologies related to boosting bass frequencies of audio.

SUMMARY

In summary, the detailed description is directed to various techniques and tools for boosting bass frequencies of audio (e.g., during audio playback using an audio playback device).

Bass frequencies of audio can be boosted using an integer bass boost filter. For example, user-settable parameters for controlling bass boost of the integer bass boost filter can be received. The user-settable parameters can comprise "c" and "s" coefficients of a coupled form structure. The integer bass boost filter can be implemented using the coupled form structure and the received user-settable parameters. The coupled form structure can be a standard coupled form structure or a modified coupled form structure.

Bass frequencies of audio can be boosted using an integer bass boost filter that is configured to use one of multiple coupled form structure implementations. For example, user-settable parameters are received. Based on the user-settable parameters, a determination is made regarding whether to use a standard or a modified coupled form structure implementation. For example, the coupled form structure implementation (standard or modified) that would produce a bass boost curve best matching the user-settable parameters is selected and used.

Bass frequencies of audio can be boosted using a linear combination of an input audio signal and output of a high-pass filter. For example, a high-pass filter, implemented using a coupled form structure implementation, is applied to an input audio signal. An output audio signal is produced by adding the input audio signal and the output of the high-pass filter. Gain is applied before adding the signals together (e.g., different gains for each signal).

In some implementations, adaptive output gain processing is used as part of a bass boost technique (e.g., applied after boosting bass frequencies of audio) in order to avoid clipping.

The described techniques and tools for bass boost can be implemented separately or in combination. For example, the techniques and tools can be implemented as stages of a digital signal processing (DSP) pipeline.

DETAILED DESCRIPTION

The following description is directed to techniques, tools, and solutions for boosting bass frequencies of audio using an integer bass boost filter.

The various techniques, tools, and solutions can be used in combination or independently. Different embodiments can implement one or more of the described techniques, tools, and solutions.

I. Computing Environment

The technologies, techniques, and solutions described herein can be implemented on any of a variety of devices (e.g., computing devices) in which audio signal processing is performed, including among other examples, computers; audio playing, transmitting and receiving equipment; portable audio players; DVD and CD players; audio conferencing; Web audio streaming applications; etc. For example, the technologies, techniques, and solutions described herein can be implemented in the audio playback system shown in FIG. 2. The technologies, techniques, and solutions described herein can be implemented in hardware circuitry (e.g., in circuitry of an ASIC, FPGA, etc.), as well as in audio processing software executing within a computing device or other computing environment (whether executed on the central processing unit (CPU), or digital signal processor (DSP), audio card, or the like), such as shown in FIG. 1.

Figure 1:
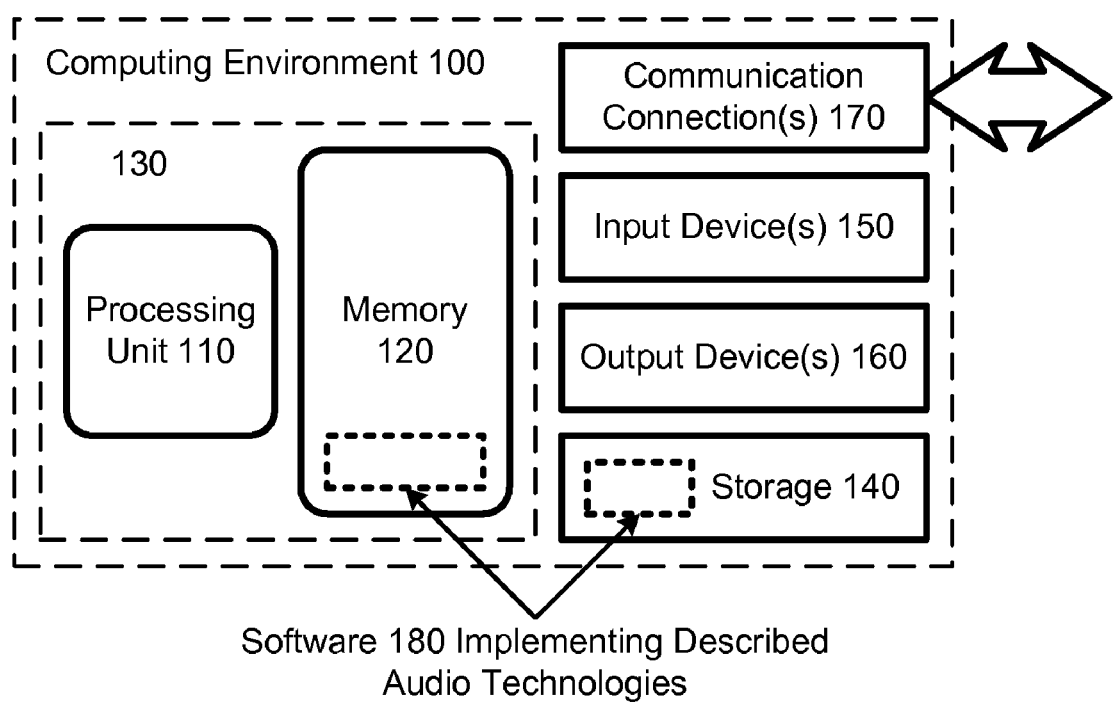
FIG. 1 is a block diagram of a suitable computing environment in which some described techniques and tools may be implemented.

FIG. 1 illustrates a generalized example of a suitable computing environment 100 in which described embodiments may be implemented. The computing environment 100 is not intended to suggest any limitation as to scope of use or functionality of the invention, as the present invention may be implemented in diverse general-purpose or special-purpose computing environments.

With reference to FIG. 1, the computing environment 100 includes at least one processing unit 110 and memory 120. In FIG. 1, this most basic configuration 130 is included within a dashed line. The processing unit 110 executes computer-executable instructions and may be a real or a virtual processor. In a multi-processing system, multiple processing units execute computer-executable instructions to increase processing power. The memory 120 may be volatile memory (e.g., registers, cache, RAM), non-volatile memory (e.g., ROM, EEPROM, flash memory, etc.), or some combination of the two. The memory 120 stores software 180 that can implement the technologies described herein. Also, as described above, the technologies described herein can also be implemented in hardware of the computing environment 100, or in a combination of software and hardware.

A computing environment may have additional features. For example, the computing environment 100 includes storage 140, one or more input devices 150, one or more output devices 160, and one or more communication connections 170. An interconnection mechanism (not shown) such as a bus, controller, or network interconnects the components of the computing environment 100. Typically, operating system software (not shown) provides an operating environment for other software executing in the computing environment 100, and coordinates activities of the components of the computing environment 100.

The storage 140 may be removable or non-removable, and includes magnetic disks, magnetic tapes or cassettes, CD-ROMs, CD-RWs, DVDs, or any other medium which can be used to store information and which can be accessed within the computing environment 100. The storage 140 can store instructions for the software 180 implementing the technologies described herein.

The input device(s) 150 may be a touch input device such as a keyboard, mouse, pen, or trackball, a voice input device, a scanning device, or another device that provides input to the computing environment 100. For audio, the input device(s) 150 may be a sound card or similar device that accepts audio input in analog or digital form, or a CD-ROM or CD-RW that provides audio samples to the computing environment. The output device(s) 160 may be a display, printer, speaker(s), CD-writer, headphones (e.g., stereo headphones) or another device that provides output from the computing environment 100.

The communication connection(s) 170 enable communication over a communication medium to another computing entity. The communication medium conveys information such as computer-executable instructions, compressed audio or video information, or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

The invention can be described in the general context of computer-readable media. Computer-readable media are any available media that can be accessed within a computing environment. By way of example, and not limitation, with the computing environment 100, computer-readable media include memory 120, storage 140, communication media, and combinations of any of the above.

The invention can be described in the general context of computer-executable instructions, such as those included in program modules, being executed in a computing environment on a target real or virtual processor. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing environment.

For the sake of presentation, the detailed description uses terms like "check," "determine," and "find" to describe computer operations in a computing environment. These terms are high-level abstractions for operations performed by a computer, and should not be confused with acts performed by a human being. The actual computer operations corresponding to these terms vary depending on implementation.

II. Example Audio Playback System

Figure 2:
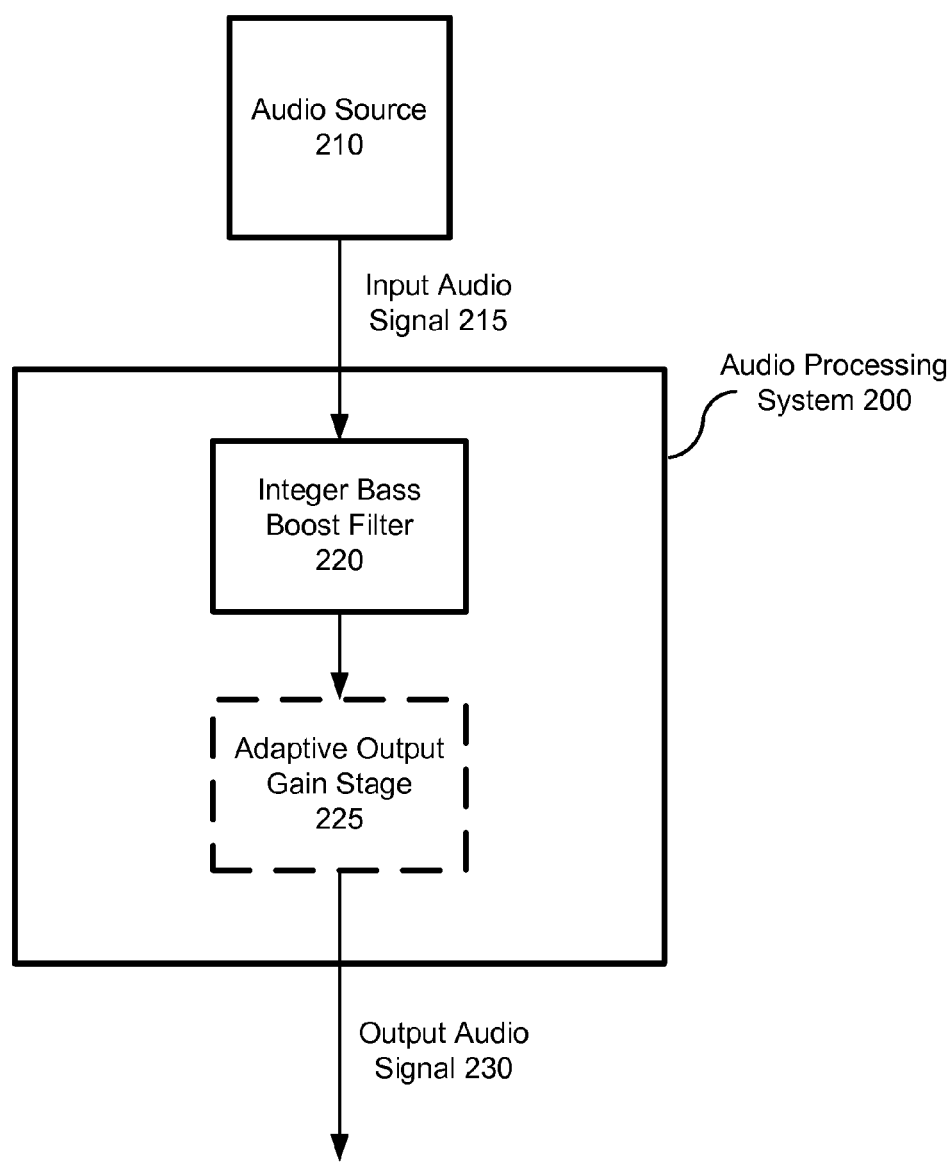
FIG. 2 is a block diagram of an audio playback system that can implement one or more of the bass boost solutions described herein.

The bass boost technologies described herein can be implemented on any of a variety of devices. For example, the system, depicted in FIG. 2, shows at a high level a device that can be used to implement the bass boost technologies described herein.

In the example audio playback system for bass boost, an audio signal 215 is obtained from an audio source 210, which may be a CD player, digital media device (e.g., a digital audio player), decoder for a digital audio stream (e.g., in a Windows Media Audio (WMA), WMA Pro, or other digital audio format), or other audio signal source. The audio signal can comprise one or more audio channels (e.g., stereo or multi-channel audio such as 5.1 or 7.1). The audio content can be coded and decoded using a variant of WMA Pro, AC3, AAC or other coding/decoding technologies. The audio source 210 can be an external source (as shown in FIG. 2), or internally integrated in the audio processing system 200.

An integer bass boost filter 220 processes the audio signal 215 (an input audio signal) to produce an output audio signal 230. In general, an integer bass boost filter is any integer implementation of a filter that boosts bass frequencies of an audio signal.

The output audio signal 230 can then be used to drive (e.g., using an audio amplifier) an audio output device, such as speakers or headphones. An optional adaptive output gain stage 225 can be incorporated in the audio processing system 200 (e.g., to prevent clipping). The integer bass boost filter 220 can apply various bass boost techniques described herein to boost bass frequencies of the input audio signal 215. In various applications, the audio processing system 200 can be implemented using a digital signal processor (DSP) or more generally a central processing unit (CPU) programmed to perform the signal processing techniques described herein.

The relationships shown between modules within the system indicate the main flow of information in the system; other relationships are not shown for the sake of simplicity. Depending on implementation and the type of processing desired in the system of FIG. 2 (or the other systems shown in the various topology and path diagrams presented in other Figures of the application), modules can be added, omitted, split into multiple modules, combined with other modules, and/or replaced with like modules.

III. Innovations in Bass Boost During Audio Playback

This section describes bass boost techniques and solutions that can be applied to playback of audio in various types of devices. For example, the techniques and solutions can be used to implement bass boost (e.g., integer bass boost) via a bass boost (e.g., integer bass boost) filter.

Example solutions for providing bass boost (e.g., for audio playback devices) can include selecting integer filter coefficients directly in the integer domain. In many implementations, for reasonable noise performance processing 16-bit data using 32-bit integer arithmetic, the coefficient resolution can be limited, for practical purposes, to 9 bits (possibly 10 bits with special care). At that coefficient resolution, a coupled form denominator structure allows very limited choices for pole locations in that implementation. Thus, the available coefficient choices can be exposed directly to the user as a reasonable number of boost settings.

Example solutions for providing bass boost can use standard coupled form structure or modified coupled form structure. In some implementations, using modified coupled form structure can effectively simulate non-integer values of one of the integer coefficients (something not possible with corresponding standard coupled form denominator without additional scale up/down of coefficients and intermediate results which adds computational overhead and reduces integer arithmetic accuracy).

Example solutions for providing bass boost can yield a 2nd order filter denominator, and a [1,−2,1] numerator provides a basic bass boost curve. However, additional boost at lower frequencies may be desirable in some situations. In some implementations, arbitrary, or near-arbitrary, amounts of boost can be obtained at lower frequencies by observing that a linear combination of the numerator and the denominator yields a filter that is also a bass boost filter (in the sense that it has an essentially flat frequency response in the audio range above bass).

Example solutions for providing bass boost (e.g., a bass boost filter) can be followed by an adaptive output gain control stage to prevent clipping.

Thus, example solutions for providing bass boost can include one or more of the following features and techniques: user-settable bass boost parameters, direct translation of integer user-settable bass boost parameters into filter coefficients, a modified coupled form structure used to obtain intermediate "boost amount" settings, creation of different bass boost shapes by using a linear combination of the numerator and the denominator, and/or use of an adaptive gain device after the bass boost filter.

Bass boost solutions can be implemented via software, hardware, or a combination thereof.

For information regarding aspects of bass correction in some implementations, see U.S. Pat. No. 7,184,556, entitled "Compensation System and Method for Sound Reproduction," issued Feb. 27, 2007.

A. Bass Boost Using Standard Coupled Form

Figure 3:
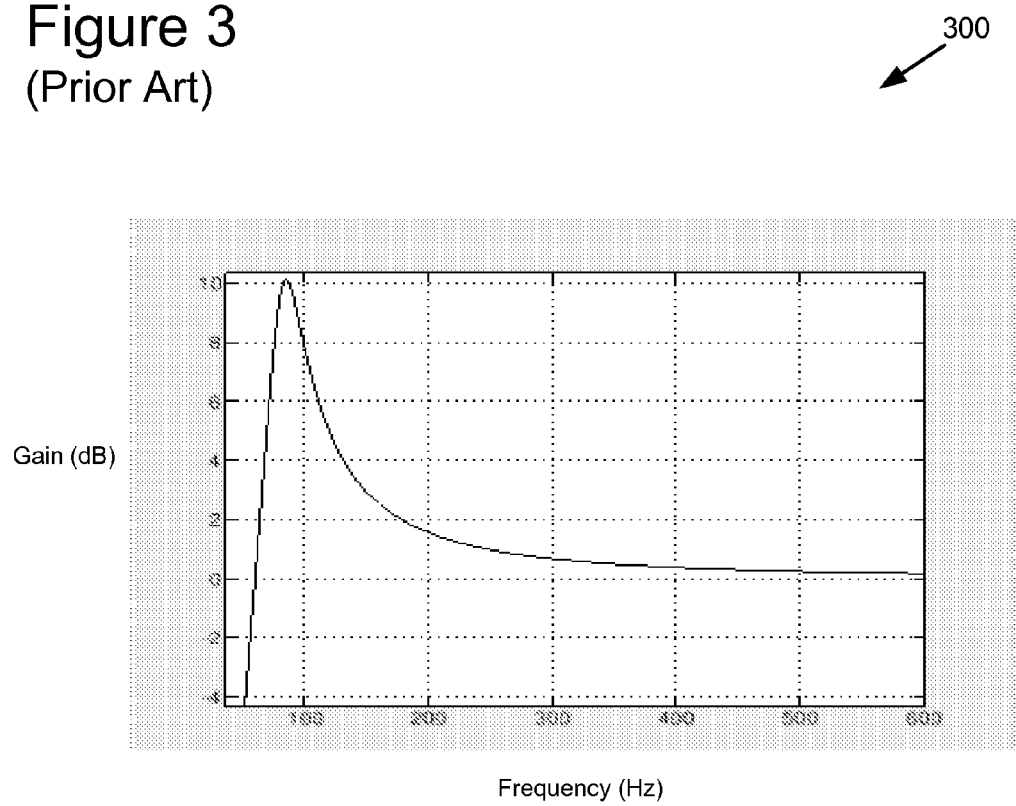
FIG. 3 depicts an example of a bass boost curve.

FIG. 3 shows an example prior art bass boost curve 300 representative of performance of a bass boost filter in typical implementations. A bass boost filter, such as a bass boost filter configured to produce the bass boost curve shape 300 depicted in FIG. 3, can strongly boost a range of frequencies where the output of a speaker of a playback device starts to weaken. The bass boost filter can also filter out frequencies below that range, where the output of the playback device speaker is often low in both amplitude and frequency, and not of particular interest.

In some implementations, the bass boost curve shape 300 is implemented by generally following the difference equation:

$$y[k] - 2*r*\cos(a)*y[k-1] + r*r*y[k-2] = x[k] - 2*x[k-1] + x[k-2]$$

where y[ ] is the output sequence, x[ ] is the input sequence, and r and a are the radius and angle, respectively, of a complex conjugate pole pair.

The Z transform of:

$$a0*y[k] + a1*y[k-1] + a2*y[k-2] = b0*x[k] + b1*x[k-1] + b2*x[k-2]$$

is:

$$Y(z)*(a0 + a1*(1/z) + a2*1/z/z) = X(z)*(b0 + b1*1/z + b2*1/z/z)$$

It is common to describe the y[k] vs. x[k] difference equation by its transfer function, which is:

$$Y(z)/X(z) = (b0 + b1*1/z + b2*1/z/z)/(a0 + a1*(1/z) + a2*1/z/z)$$

As such, the y[k] side of the difference equation (a0, a1, a2) is sometimes referred to as the denominator; it is the denominator in the Z-domain representation.

Filtering an input sequence x[ ] to produce output y[ ] at y[k], the following C code can be used to implement the denominator of the above difference equation using an example implementation of a standard coupled form structure with 9 bits of coefficient precision:

$$P0 = m*(x[k] + x[k-2] - 2*x[k-1]) - ((s*z1) >> 9) + ((c*p1) >> 9)$$

$$z1 = ((s*p1) >> 9) + ((c*z1) >> 9)$$

$$p1 = p0$$

$$y[k] = z1$$

where:
c=2^9*r*cos(a) and s=2^9*r*sin(a) are integer representations of the couple form multiplicative constants, referred to herein as "c" and "s" parameters;
z1, p1, and p0 are values of nodes in the coupled form denominator structure; and
m is a pre-filter multiplier designed to reduce signal distortion from integer quantization within the filter.

Alternatively, a standard coupled form structure is implemented using different logic and/or precision.

Figure 6:
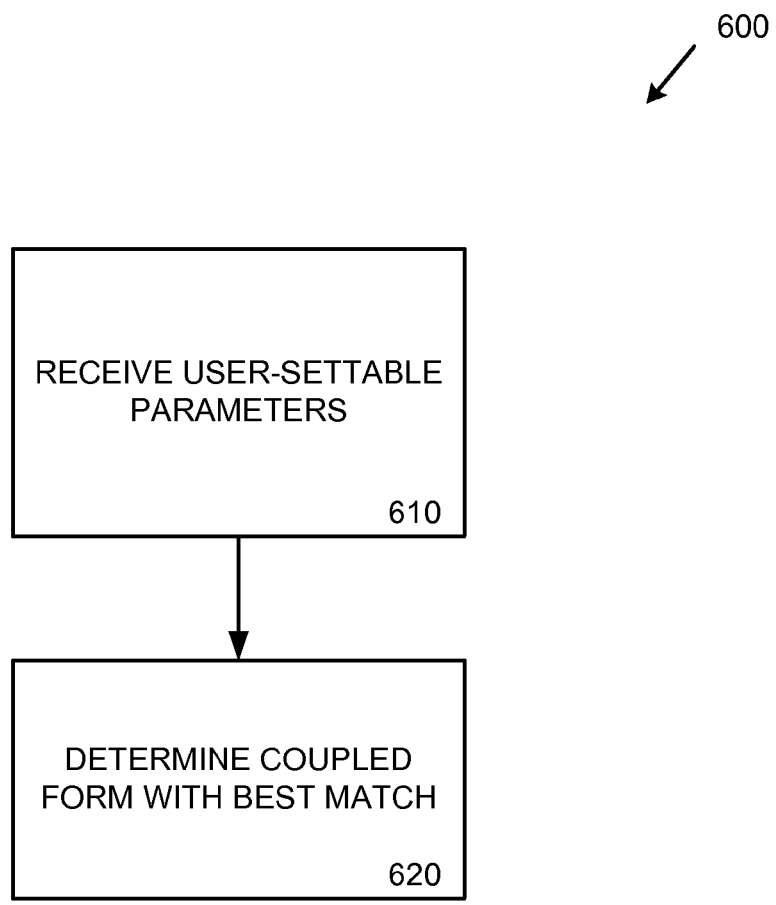
FIG. 6 depicts an example method for selecting between standard and modified coupled form structures.

The example implementation of a standard coupled form structure described above is based on the coupled form illustrated in FIG. 6.43 from "Discrete-Time Signal Processing" by Oppenheim & Schafer, Prentice-Hall 1999, second edition ("Oppenheim"). FIG. 6.43 from Oppenheim illustrates an example of a signal flow diagram representing pseudocode for an example implementation of a standard coupled form.

B. User-Settable Parameters

In some implementations, bass boost can be configured by a user (e.g., a user of an audio playback system). For example, the user can provide bass boost parameters which can be used for controlling bass boost (e.g., used as coefficients of an integer bass boost filter of the audio playback system). Bass boost parameters that are provided directly or indirectly by a user can be called user-settable parameters.

Bass boost parameters can be provided by a user in a variety of ways. For example, the user can enter bass boost parameters using a user interface (e.g., a user interface produced by an audio playback system). The user interface can provide user interface elements, such as entry boxes, sliders, drop-down lists, wizards, or other types of user interface elements, for receiving the bass boost parameters from the user.

The following example table (Table 1) describes available boost frequencies and amounts as a function of the integer representations of the pole's real and imaginary components (parameters "c", "s"), using standard coupled form structure. The "c" parameter in Table 1 is a linear function derived from the pole's real component, and will be converted to the pole's real part using a simple translation before bass boost filtering is applied. In a particular embodiment, 9 precision bits can be generally sufficient to allow reasonable flexibility in the peak frequency selection.

TABLE 1

Boost amount (dB) @ boost center frequency (Hz)
(for 44 kHz sampling)

| s | c = 1 | c = 2 | c = 3 |
|---|---|---|---|
| 2 | 2.0 @ 40 | | |
| 3 | 4.5 @ 48 | | |
| 4 | 6.7 @ 60 | 2.0 @ 79 | |
| 5 | 8.5 @ 73 | 3.4 @ 87 | |
| 6 | 10.1 @ 85 | 4.6 @ 96 | 2.1 @ 118 |
| 7 | 11.5 @ 99 | 5.8 @ 108 | 3.0 @ 124 |
| 8 | 12.7 @ 112 | 6.8 @ 120 | 3.9 @ 134 |
| 9 | 13.9 @ 126 | 7.8 @ 133 | 4.7 @ 144 |
| 10 | 15.0 @ 139 | 8.8 @ 145 | 5.5 @ 155 |
| 11 | 16.0 @ 152 | 9.6 @ 158 | 6.3 @ 168 |
| 12 | 16.9 @ 166 | 10.4 @ 171 | 7.0 @ 179 |
| 13 | 17.9 @ 180 | 11.2 @ 184 | 7.7 @ 192 |
| 14 | 18.8 @ 193 | 11.9 @ 197 | 8.3 @ 204 |
| 15 | 19.7 @ 206 | 12.7 @ 211 | 9.0 @ 217 |
| 16 | 20.6 @ 221 | 13.4 @ 224 | 9.6 @ 229 |
| 17 | 21.5 @ 235 | 14.0 @ 237 | 10.2 @ 244 |
| 18 | 22.4 @ 248 | 14.7 @ 252 | 10.8 @ 257 |
| 19 | 23.4 @ 261 | 15.3 @ 266 | 11.3 @ 269 |
| 20 | 24.3 @ 276 | 16.0 @ 278 | 11.9 @ 281 |

In some implementations, a user can provide "c" and "s" user-settable parameters for controlling bass boost. A user interface can display user interface elements for receiving "c" and "s" parameters directly (e.g., without translation) from a user of the user interface. For example, the user interface can display a slider user interface element allowing the user to select a "c" parameter value from 1 to 3, and another slider user interface element allowing the user to select an "s" parameter value from 2 to 20 (corresponding to the values in Table 1 above). Illustrating a specific example, if a user sets the "c" parameter slider to 2, and the "s" parameter slider to 17, then a bass boost of 14 dB at 237 Hz can be implemented (e.g., an integer bass boost filter can receive the "c" and "s" parameters and use them to filter an input audio signal with a bass boost curve using a coupled form structure, such as a standard coupled form structure, to produce a bass boosted output audio signal).

Instead of providing both "c" and "s" user-settable parameters, a user can provide one or the other. For example, the value of "c" can be fixed (e.g., at 2), and the user can provide only the "s" value.

In other implementations, a user can provide bass boost parameters other than direct "c" and/or "s" values. For example, the user can provide a desired peak boost frequency and then be provided with available boost amounts. To illustrate this example, if a user selects a desired peak boost frequency of 180 Hz, then the user interface can display available boost amounts close to 180 Hz. Using Table 1 above, the user interface can display available bass boost amounts of 17.9 dB, 11.2 dB, and 7.0 dB (corresponding to c=1, 2, and 3, respectively).

In yet other implementations, the user can provide bass boost parameters other than direct "c" and/or "s" values and the "c" and "s" values can be determined using simple translation. For example, the "s" parameter can be obtained directly from a desired peak boost frequency (e.g., entered by a user) using an approximation, e.g., s=(f+7)/13 (or another approximation, such as a more complex approximation if additional accuracy is desired). Similarly, the "c" parameter can be obtained from a desired boost amount (e.g., entered by a user) using an approximation given the boost amount at a given frequency. Bass boost can therefore be implemented using code with integer approximations for c and s, for example:

```
Void filter(int x[ ], int y[ ], float fHz, float fBoostDB)
{
    Int s = (f + 7) / 13;
    Int c = // Table 1, or some other approximation or table lookup;
    c = (1 << 9) – c;
    for (every input sample in x[ ])
    {
        P0 = m * (x[k] + x[k–2] – 2 *x[k–1]) – ((s * z1) >> 9) +
            ((c * p1) >> 9);
        z1 = ((s * p1) >> 9) + ((c * z1) >> 9);
        p1 = p0;
        y[k] = z1;
    }
}
```

Alternatively, an integer implementation of bass boost with a standard coupled form uses different logic, precision and/or integer approximations.

C. Modified Coupled Form

Using 9 bits of precision (which, in some architectures, is a practical limit for reasonable noise performance with no multiplication overflows) allows very limited choices of the bass boost amount in some implementations. Table 1 shows three choices for c. For example, at 270 Hz, the choices, as integer approximations, are 24 dB (c=1), 16 dB (c=2), or 12 dB (c=3). It can be desirable in audio applications to have more granular control of the bass boost amount.

Consider the following coupled form structure which is an example implementation of a modified coupled form structure, which is different from the example implementation of a standard coupled form structure defined in section III(A) above.

$$p1=m*(x[k]+x[k-2]-2*x[k-1])-((s*z1)>>9)+((c*p1)>>9)$$

$$z1=((s*p1)>>9)+((c*z1)>>9)$$

$$y[k]=z1$$

Compared to the original denominator structure implementation described in section III(A) above (which was $y[k]-2*r*\cos(a)*y[k-1]+r*r*y[k-2]$), the example implementation of a modified coupled form structure implements a different denominator:

$$y[k]+((r*\sin(a))^2-2*r*\cos(a))*y[k-1]+r*\cos(a))^2*y[k-2]$$

Figure 4:
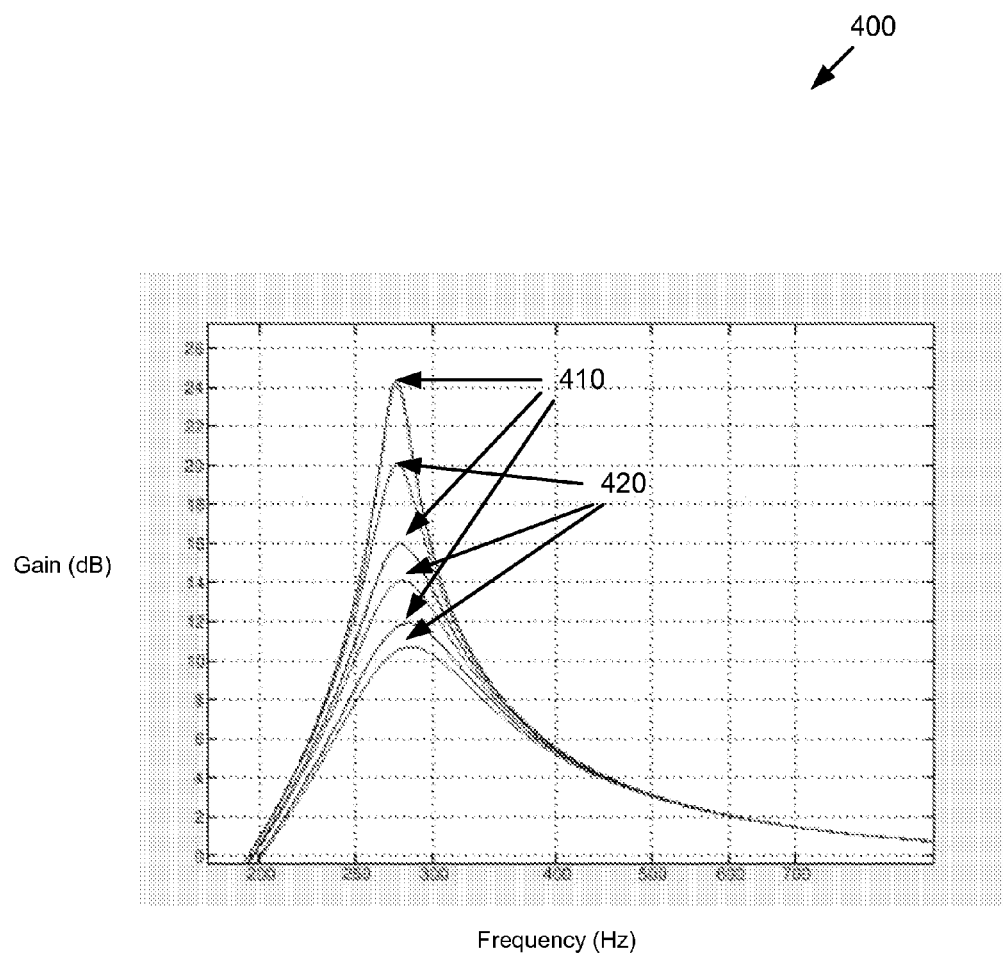
FIG. 4 depicts examples of frequency response curves using original and modified coupled form denominators for bass boost.

This modified denominator, for different integer values of $r*\cos(a)$, provides a set of amplitude frequency responses that fall approximately half way between what can be obtained using the same integer values of $r*\cos(a)$ with the corresponding standard coupled form structure described above. For example, for a particular choice of the "s" coefficient (peak frequency), the family of frequency responses possible with the example standard coupled form 410 and example modified coupled form 420 denominators are shown in the curves 400 of FIG. 4.

Using such a standard coupled form structure and such a modified coupled form structure together, it is possible to implement an integer bass boost filter which effectively approximates values of "c" in multiples of 0.5 rather than 1.0, providing more granularity in available bass boost curves. In some implementations, an integer bass boost filter can switch between using a standard coupled form structure and a modified coupled form structure depending on which would produce a bass boost curve that best matches desired parameters entered by a user (e.g., a desired peak boost frequency and/or a desired boost amount). For example, the following code will switch between example implementations of standard and modified coupled form structures depending on the value of cParam (a value entered by a user indicating desired boost amount; a cParam value of 1.0, 2.0, or 3.0 will use standard coupled form implementation and a cParam value of 1.5, 2.5, or 3.5 will use modified coupled form implementation).

```
Void filter(int x[ ], int y[ ], float cParam) // cParam is a multiple of 0.5
{
   Int c = round(cParam * 2) ;
   Bool fModified = (c % 2);
   c = c / 2;
   c = (1 <<9 ) – c;
   for (every input sample in x[ ])
   {
      P0 = k * (x[k] + x[k–2] – 2 *x[k–1]) – ((s * z1) >> 9) +
((c * p1) >> 9);
      If (fModified)
         P1 = p0;
      z1 = ((s * p1) >> 9) + ((c * z1) >> 9);
      p1 = p0;
      y[k] = z1;
   }
}
```

In the above code, having cParam greater than or equal to 1.0 helps avoid undesirable results. For example, a cParam value of 0.5 can result in the filter being unstable (depending on values of "s"). The above code will also operate with values of cParam that are not multiples of 0.5 because the "round(cParam*2)" function will convert cParam to a multiple of 0.5 (scaled by 2). For example, cParam values of 1.5 and 1.4 will both result in a "c" value of 3.

In the above code, the value of modified will determine whether the standard or modified coupled form implementation is used. Specifically, if the value of "c" is even, then "c % 2" will evaluate to 0 (false) and standard coupled form implementation will be used. If the value of "c" is odd, then "c % 2" will evaluate to 1 (true) and modified coupled form implementation will be used.

Figure 5:
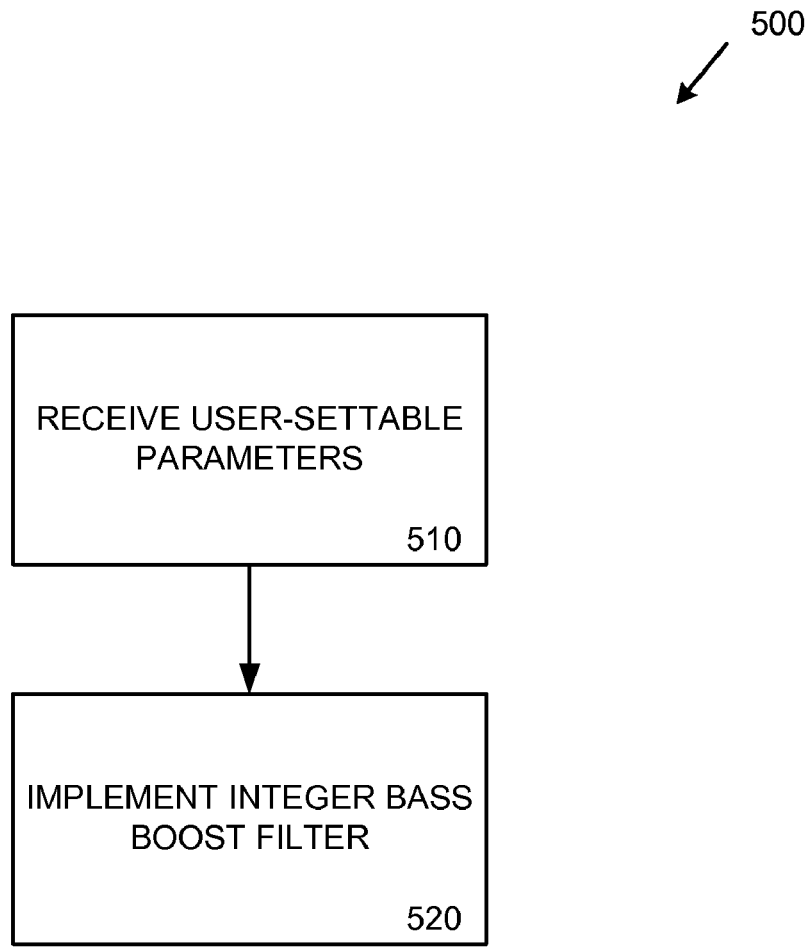
FIG. 5 depicts an example method for boosting bass frequencies of audio.

FIG. 5 depicts an example method 500 of boosting bass frequencies of audio using an integer bass boost filter. At 510, user-settable parameters for controlling bass boost are received. For example, the user-settable parameters can comprise "c" and "s" coefficients (e.g., entered directly by a user via a user interface). User-settable parameters other than direct "c" and "s" values can also be received. For example, a user can enter a desired boost amount and/or a desired peak boost frequency and from these values "c" and/or "s" values can be calculated using simple translation (e.g., using the example code above).

At 520, the integer bass boost filter is implemented using a coupled form structure and using the received user-settable parameters. For example, a standard coupled form structure can be used in implementing the integer bass boost filter (e.g., using received "c" and "s" user-settable parameters). Alternatively, a modified coupled form structure can be used, or a combination of standard and modified coupled form structures (e.g., selecting between implementations of standard and modified coupled form structure depending on the received user-settable parameters) can be used. The integer bass boost filter can be applied to an input audio signal to produce an output audio signal with bass frequencies boosted by the integer bass boost filter. Alternatively, an audio tool uses user-settable parameters to adjust bass boost using a non-integer bass boost filter (e.g., a bass boost filter implemented partially or fully using floating point math).

FIG. 6 depicts an example method 600 of switching between implementations of standard and modified coupled form structures for boosting bass frequencies of audio using an integer bass boost filter. For example, the integer bass boost filter can be configured to use implementations of a standard coupled form structure as well as implementations of a modified coupled form structure. The integer bass boost filter can switch between using implementations of standard or modified coupled form structures depending on received user-settable parameters.

At 610, one or more user-settable parameters are received. For example, a desired bass boost amount user-settable parameter can be received. At 620, a determination is made to use an implementation of a standard or modified coupled form structure. For example, a selection can be made between implementations of standard and modified coupled form structures depending on which would produce a bass boost curve that best matches the desired bass boost amount.

Alternatively, an implementation of bass boost that switches between different denominator forms uses different logic and/or precision. Or, an audio tool switches between implementations of standard and modified coupled form structures in a non-integer bass boost filter.

D. Linear Combination of High-Pass Filter Output and Original Input

Figure 7:
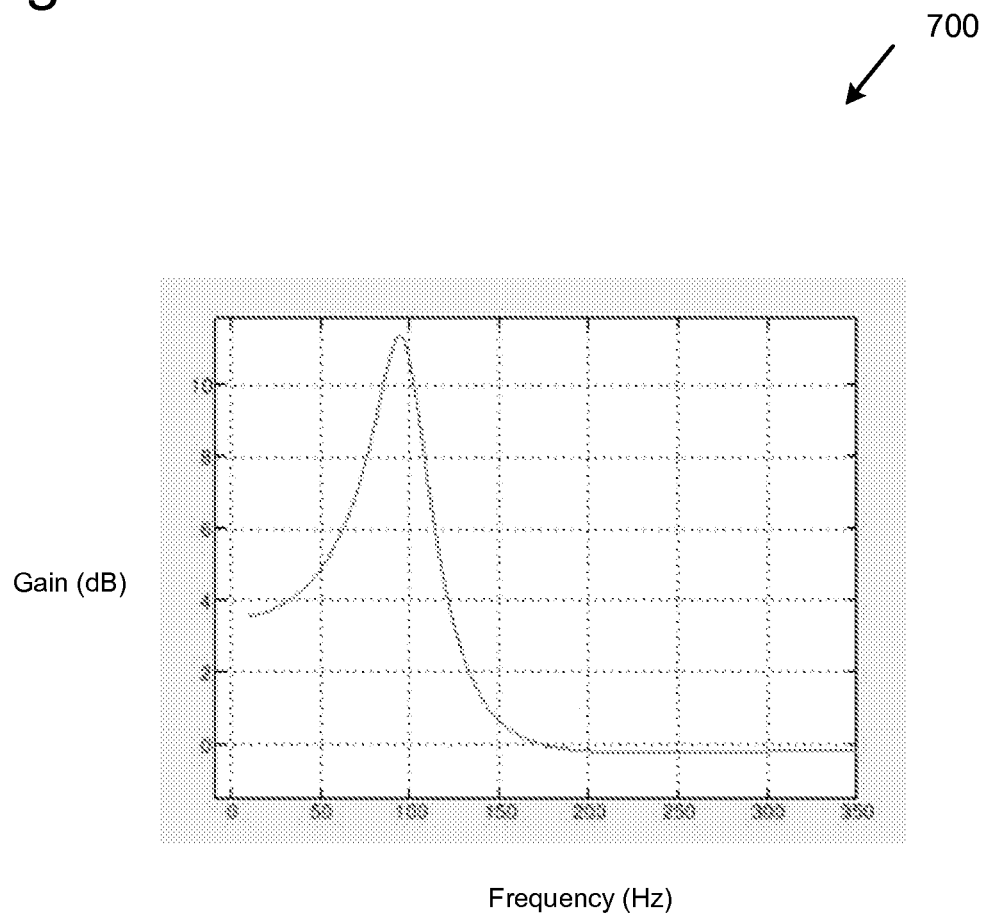
FIG. 7 depicts an example frequency response curve of a linear combination of high-pass filter output and original input for bass boost.

In some applications, it can be desirable to maintain some amount of bass boost even for frequencies lower than the peak boost frequency. Curves, such as the curve 700 depicted in FIG. 7, can be created, for example, by using a numerator that is a linear combination of [1,–2,1] (the numerator described in section III(A) above) and the denominator. If $Y(z)/X(z)$ is the transfer function of the filter producing the curve shown in FIG. 3, its complement, $(Y(z)-X(z))/Y(z)$, is a high-pass filter ($Y(z)$ and $X(z)$ are polynomials for the numerator and denominator, respectively).

Figure 8:
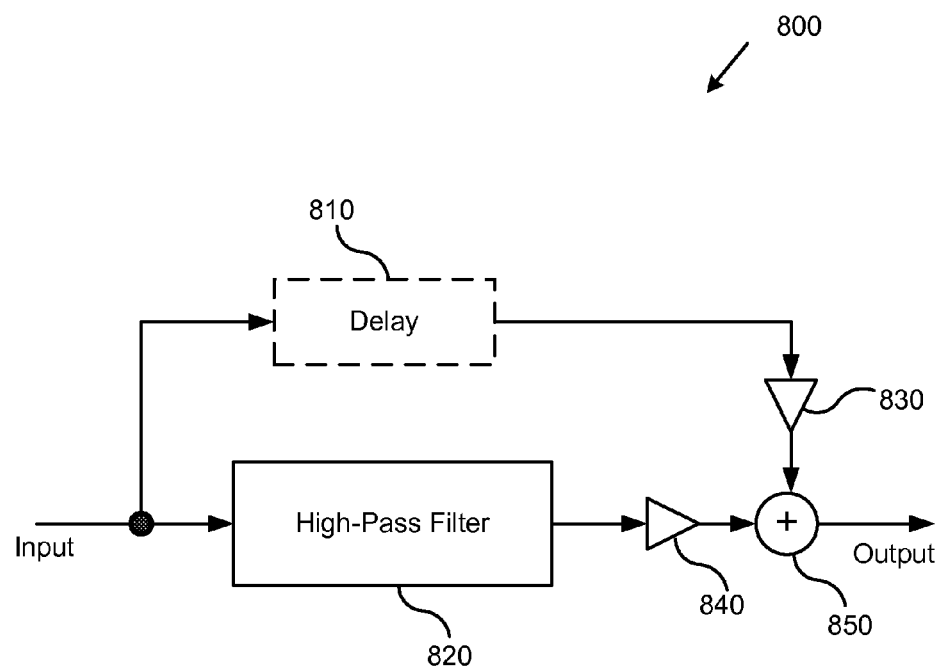
FIG. 8 depicts an example block diagram of a linear combination of high-pass filter output and original input.

FIG. 8 depicts a block diagram 800 for an implementation of a linear combination of high-pass filter output and original input. For example, the block diagram 800 can be implemented by an audio playback device to boost low frequencies arbitrarily using a linear combination of high-pass filter output and original input. In the block diagram 800, an input audio signal is split into two paths. The lower path passes through a high-pass filter 820 (e.g., a filter implemented using a standard coupled form or a modified coupled form) and then through a gain device 840. Depending on whether the standard coupled form implementation or modified coupled form implementation is used for the high-pass filter 820, a delay 810 may be needed for the upper path. If the high-pass filter 820 uses a standard coupled form implementation, then the delay 810 will be used (e.g., the delay 810 will be needed to ensure proper operation of the filter when using a standard coupled form implementation). However, if the high-pass filter 820 uses a modified coupled form implementation, then the delay 810 is not used (e.g., when using a modified coupled form implementation, the filter operates properly without requiring the delay 810). Regardless of whether a delay 810 is used in the upper path, the upper path will then proceed through a gain device 830. In some implementations, to achieve bass boost, the gain of 830 is larger than the gain of 840. For example, if the gain of 830 is "a," then the gain of 840 can be "1–a" (where a >=1). At 850, the two paths are combined (e.g., using an adder) producing an output audio signal.

Figure 9:
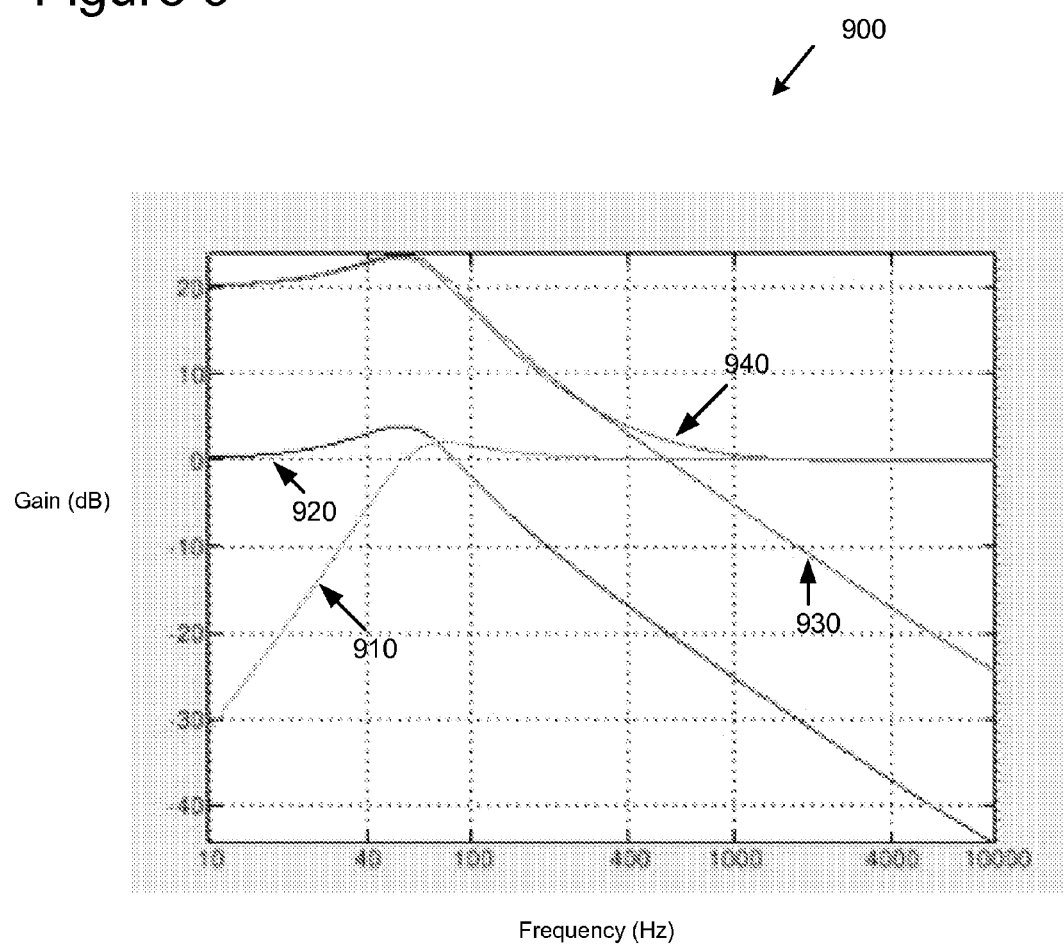
FIG. 9 depicts example frequency response curves illustrating a linear combination of high-pass filter output and original input.

FIG. 9 depicts example frequency response curves 900 illustrating a linear combination of high-pass filter output and original input in some implementations. Frequency response curve 910 is for the high-pass filter output, based on the transfer function $Y(z)/X(z)$. Frequency response curve 920 is for the input minus the high-pass filter output, based on a transfer function of $1-Y(z)/X(z)$. Note that this is a low-pass filter. Frequency response curve 930 is for the low-pass filter scaled up by a desired gain (10 in this figure), based on transfer function: $10*(1-Y(z)/X(z))$. Frequency response curve 940 is for the sum of curves 930 and 910; it's based on the transfer function that is the sum of $Y(z)/X(z)$ and $10*(1-Y(z)/X(z))$, which can be rewritten as $10-9*Y(z)/X(z)$ and thus implemented with an adder with 2 scaled inputs.

E. Combined Implementation

Figure 10:
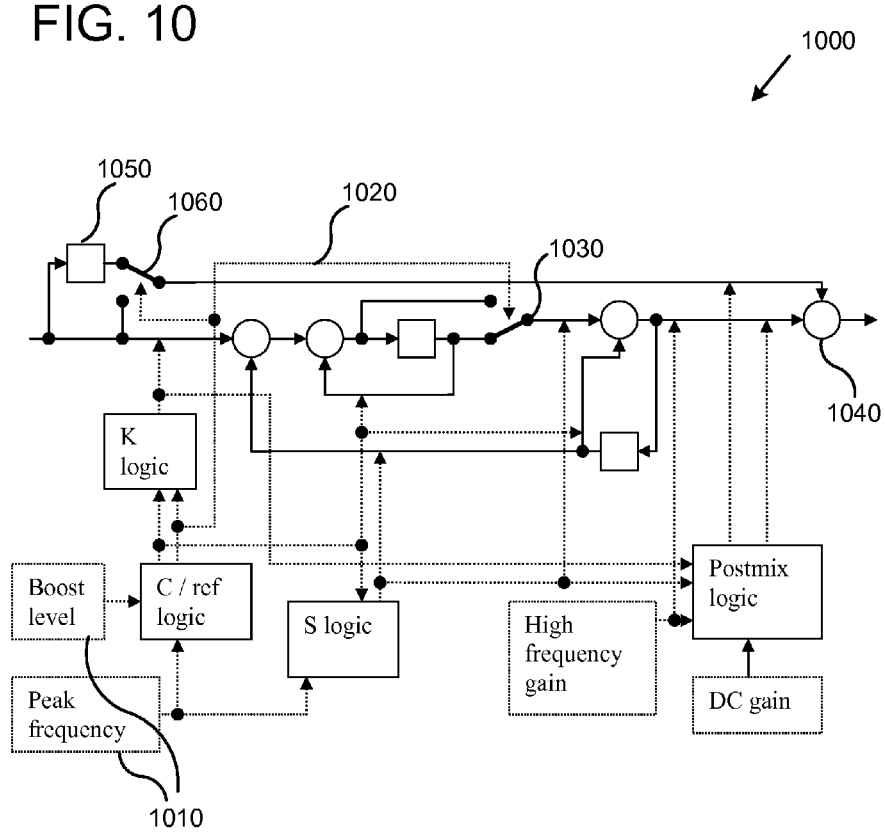
FIG. 10 depicts an example combined implementation.

A combined implementation of an integer bass boost filter using implementations of a standard coupled form and implementations of a modified coupled form along with a linear combination of high-pass filter output and original input can be created. FIG. 10 depicts an example combined implementation 1000. In the combined implementation 1000, a circle denotes addition, a square denotes a 1-sample delay, a solid line is a signal line, a dashed line is a coefficient or boolean line (set at initialization time, constant afterwards), a dashed line pointing into a solid line denotes multiplication by coefficient, and a dashed line pointing into a switch denotes multiplexing.

In the combined implementation 1000, "c" and "s" parameters are received 1010, either directly or using simple translation. Depending on the values of "c" and/or "s," a standard coupled form or modified coupled form implementation will be used by the integer bass boost filter. The "ref" line 1020 coming out of the "C/ref logic" box indicates whether standard or modified coupled implementation form is used. A ref value of "0" means that modified coupled form implementation is used, and a ref value of "1" means that standard coupled form implementation is used. Note how the "ref" line 1020 controls the filter structure by controlling switch 1030. In the combined implementation 1000, the linear combination of high-pass filter output and original input occurs at the adder 1040 and the "Postmix logic" box which controls the gains of the two signals (high-pass filter output and original input) feeding into the adder 1040. Depending on whether standard or modified coupled form implementation is used, a 1-sample delay 1050 may be needed. If the ref value is "1" (standard coupled form implementation is used), then the ref line 1020 will control switch 1060 to add the 1-sample delay 1050. If the ref value is "0" (modified coupled form implementation is used), then the ref line 1020 will control switch 1060 to remove the 1-sample delay 1050.

F. Adaptive Output Gain

In some scenarios, it is generally desirable for a bass boost filter to have a gain of 1 at medium and high frequencies. This can help avoid substantial level changes when boost is turned on/off.

Under such constraints, bass boost implies a gain of significantly greater than 1 at low frequencies. To achieve this result without clipping (distortion), the bass boost filter can be followed by an adaptive gain stage implemented, for example, as shown in the following pseudocode:

Scan the next block if input, noting its maximum PCM value
Find the maximum gain that could be applied to the next block without 16-bit output overflows
If the maximum gain found in the previous step exceeds the current gain
   Determine the gain that would exist at the end of the current block if the gain were to be increased at the "release rate" over the course of the current block
   Check if the gain that would exist at the end of the current block multiplied by the larger of { the maximum input PCM value of the current block, the maximum input PCM value of the next block} would lead to an integer overflow
   If no integer overflow in the previous step
     Prepare to release (increase) the gain over the current block at "release rate"
   Else
     Prepare to decrease the gain over the current block at a rate ("attack rate") such that the gain at the end of the current block multiplied by the maximum input PCM value of the next block does not result in overflow
Process the current block, applying a gain to each sample, adjusting the gain after each sample according to either "attack rate" or "release rate" (or neither), as determined above
Shift blocks to the left by one ("current" block is produced as output, "next" block becomes "current", and a new input block is received as "next") and return to the top of this algorithm The above logic operates on two adjacent blocks of audio data at a time: the "next" block of data is used to "look into the future" to determine which way the gain should be adjusted, and the "current" block is the one that gain is applied to (i.e., if the audio stream consists of blocks A, B, C, D, E, . . . , the above pseudocode would be first applied to blocks A and B, then to blocks B and C, then to blocks C and D, and so on).

Alternatively, the adaptive output gain follows different timing (e.g. not block-by-block) and/or applies a different look ahead.

Figure 11:
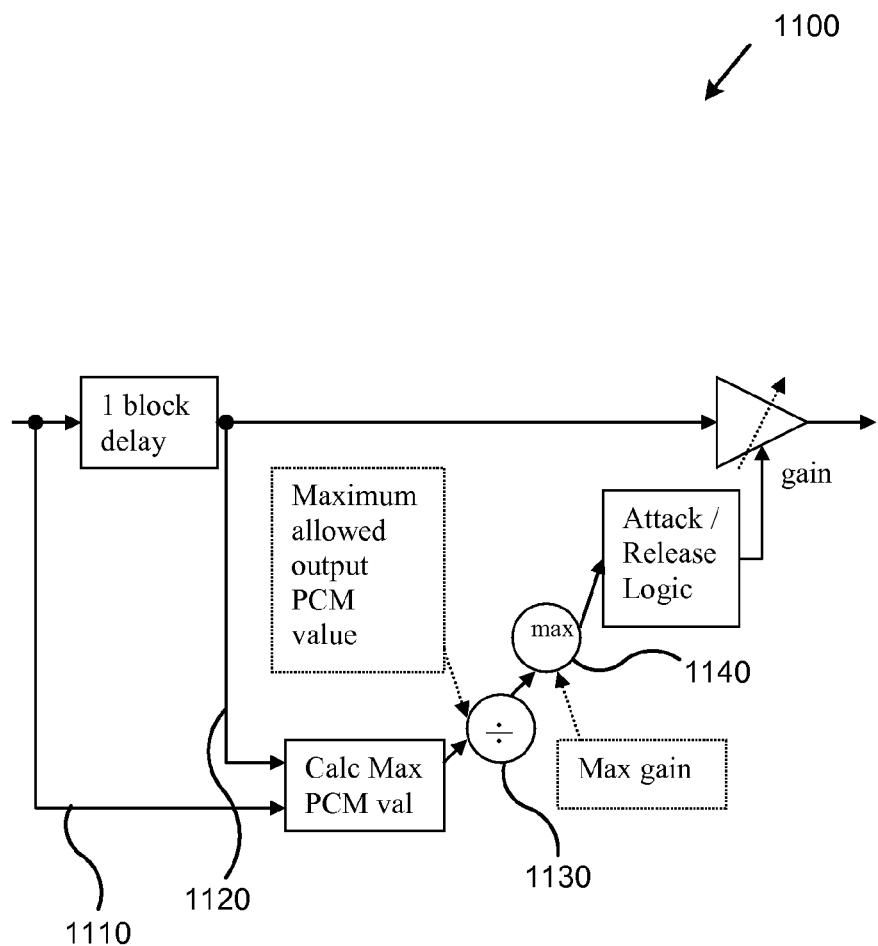
FIG. 11 depicts an example diagram of an adaptive output gain stage.

FIG. 11 illustrates an implementation of an adaptive output gain stage similar to the pseudocode above. FIG. 11 displays an example block-level diagram of an adaptive output gain circuit 1100. In the diagram, the current block 1110 and the previous block 1120 (delayed by 1) are received. The maximum gain that can be applied is calculated by dividing 1130 the maximum allowed PCM output value (e.g., maximum allowed output PCM value of 32767) by the maximum PCM value from the current block 1110 and the previous block 1120. The maximum gain that can be applied is then capped 1140. In general, the maximum gain that can be applied is capped at 1.0, but depending on the implementation a different cap may be appropriate (e.g., 2.0). Depending on the maximum gain that can be applied, the "attack/release logic" will control the gain applied to the audio signal. For example, the above pseudocode describes one way of implementing the attack/release logic.

The adaptive output gain stage 1100 can act, in some ways, as a limiter. It can reduce the signal when it is too loud, while not emphasizing the signal when it is quiet.

The bass boost techniques and solutions described in this application can be used in various combinations to implement a bass boost filter. For example, an integer bass boost filter can use a combination of standard coupled form implementation and modified coupled form implementation (e.g., switching between the two depending on user-settable parameters). Or, an integer bass boost filter can use a single coupled form implementation (standard or modified) with user-settable parameters. Or, an integer bass boost filter can be implemented using only modified coupled form structure implementation. Any of these bass boost filter designs can be implemented with or without adaptive output gain.

Any of the methods described herein can be performed via one or more computer-readable media (e.g., storage or other tangible media) having computer-executable instructions for performing (e.g., causing a computing device or computer to perform) such methods. Operation can be fully automatic, semi-automatic, or involve manual intervention.

Having described and illustrated the principles of our innovations in the detailed description and accompanying drawings, it will be recognized that the various embodiments can be modified in arrangement and detail without departing from such principles. It should be understood that the programs, processes, or methods described herein are not related or limited to any particular type of computing environment, unless indicated otherwise. Various types of general purpose or specialized computing environments may be used with or perform operations in accordance with the teachings described herein. Elements of embodiments shown in software may be implemented in hardware and vice versa.

In view of the many possible embodiments to which the principles of our invention may be applied, we claim as our invention all such embodiments as may come within the scope and spirit of the following claims and equivalents thereto.

We claim:

1. A method of boosting bass frequencies of audio using a bass boost filter, the method comprising:
   implementing the bass boost filter using plural coupled form structure implementations, wherein the bass boost filter is configured to use any of the plural coupled form structure implementations;
   receiving one or more user-settable parameters for controlling the bass boost filter, wherein the one or more user-settable parameters comprise a desired bass boost amount;
   selecting which of the plural coupled form structure implementations produces a bass boost curve with a bass boost amount closest to the desired bass boost amount; and
   using the selected coupled form structure implementation when filtering an input audio signal using the bass boost filter.

2. The method of claim 1 further comprising:
   applying the bass boost filter to the input audio signal.

3. The method of claim 2 further comprising:
   applying adaptive output gain processing following the bass boost filter, wherein the adaptive output gain processing determines a maximum gain that can be applied.

4. The method of claim 1 wherein the bass boost filter is implemented using the received one or more user-settable parameters.

5. The method of claim 1 wherein the plural coupled form structure implementations include a standard coupled form structure implementation and a modified coupled form structure implementation, the method further comprising: selecting between using the standard coupled form structure implementation or the modified coupled form structure implementation in response to analyzing the one or more user-settable parameters received from a user via a user interface.

6. The method of claim 1 wherein the plural coupled form structure implementations include a standard coupled form structure implementation and a modified coupled form structure implementation, and wherein the bass boost filter uses the standard coupled from structure implementation to filter the input audio signal if the standard coupled form structure implementation would result in a bass boost curve that best matches the one or more user-settable parameters and otherwise the bass boost filter uses the modified coupled from structure implementation to filter the input audio stream if the modified coupled form structure implementation would result in a bass boost curve that best matches the one or more user-settable parameters.

7. The method of claim 4 wherein the received one or more user-settable parameters comprise a plurality of user-settable parameters for controlling bass boost of the bass boost filter, wherein the plurality of user-settable parameters comprise "c" and "s" coefficients of the plural coupled form structure implementations.

8. The method of claim 4 wherein the one or more user-settable parameters are received directly from a user via a user interface.

9. The method of claim 1 wherein the plural coupled form structure implementations are implemented with 9 bits of coefficient resolution.

10. A computing device comprising:
    a processing unit; and
    memory;
    wherein the computing device is configured to perform operations for boosting bass frequencies of audio using a bass boost filter, the operations comprising:
    implementing the bass boost filter using plural coupled form structure implementations, wherein the bass boost filter is configured to use any of the plural coupled form structure implementations;
    receiving one or more user-settable parameters for controlling the bass boost filter, wherein the one or more user-settable parameters comprise a desired bass boost amount;
    selecting which of the plural coupled form structure implementations produces a bass boost curve with a bass boost amount closest to the desired bass boost amount; and
    using the selected coupled form structure implementation when filtering an input audio signal using the bass boost filter.

11. The computing device of claim 10, the operations further comprising:
    applying the bass boost filter to the input audio signal.

12. The computing device of claim 11, the operations further comprising:
    applying adaptive output gain processing following the bass boost filter, wherein the adaptive output gain processing determines a maximum gain that can be applied.

13. The computing device of claim 10
    wherein the bass boost filter is implemented using the received one or more user-settable parameters.

14. The computing device of claim 10 wherein the plural coupled form structure implementations include a standard coupled form structure implementation and a modified coupled form structure implementation, the operations further comprising:
    selecting between using the standard coupled form structure implementation or the modified coupled form structure implementation in response to analyzing the one or more user-settable parameters received from a user via a user interface.

15. The computing device of claim 10 wherein the plural coupled form structure implementations include a standard coupled form structure implementation and a modified coupled form structure implementation, and wherein the bass boost filter uses the standard coupled from structure implementation to filter the input audio signal if the standard coupled form structure implementation would result in a bass boost curve that best matches the one or more user-settable parameters and otherwise the bass boost filter uses the modified coupled from structure implementation to filter the input audio stream if the modified coupled form structure implementation would result in a bass boost curve that best matches the one or more user-settable parameters.

16. One or more computer-readable storage media storing computer-executable instructions for causing a computing device to perform the method of boosting bass frequencies of audio using a bass boost filter, the method comprising:
- implementing the bass boost filter using plural coupled form structure implementations, wherein the bass boost filter is configured to use any of the plural coupled form structure implementations;
- receiving one or more user-settable parameters for controlling the bass boost filter, wherein the one or more user-settable parameters comprise a desired bass boost amount;
- selecting which of the plural coupled form structure implementations produces a bass boost curve with a bass boost amount closest to the desired bass boost amount; and
- using the selected coupled form structure implementation when filtering an input audio signal using the bass boost filter.

17. The computer-readable storage media of claim 16 wherein the plural coupled form structure implementations include a standard coupled form structure implementation and a modified coupled form structure implementation, and wherein the bass boost filter uses the standard coupled from structure implementation to filter the input audio signal if the standard coupled form structure implementation would result in a bass boost curve that best matches the one or more user-settable parameters and otherwise the bass boost filter uses the modified coupled from structure implementation to filter the input audio stream if the modified coupled form structure implementation would result in a bass boost curve that best matches the one or more user-settable parameters.

* * * * *